United States Patent [19]

Komabayashi et al.

[11] Patent Number: 5,009,717
[45] Date of Patent: Apr. 23, 1991

[54] THERMOELECTRIC ELEMENT AND METHOD OF MANUFACTURING SAME

[75] Inventors: Masashi Komabayashi; Kunio Kuramochi; Kenichi Hijikata, all of Ohmiya, Japan

[73] Assignee: Mitsubishi Metal Corporation, Tokyo, Japan

[21] Appl. No.: 550,879

[22] Filed: Jul. 11, 1990

[30] Foreign Application Priority Data

Jul. 18, 1989 [JP] Japan .................................. 1-185767
Apr. 11, 1990 [JP] Japan .................................. 2-95868
Apr. 25, 1990 [JP] Japan .................................. 2-109802

[51] Int. Cl.$^5$ ...................... H01L 35/34; H01L 35/12
[52] U.S. Cl. .................... 136/201; 136/205; 136/236.1
[58] Field of Search ............ 136/201, 205, 222, 236.1, 136/242, 239

[56] References Cited

U.S. PATENT DOCUMENTS

| | | |
|---|---|---|
| 2,981,775 | 4/1961 | Bachman ................................ 136/5 |
| 3,790,829 | 2/1974 | Roth ........................................ 310/4 |
| 4,477,686 | 10/1984 | Nakajima et al. ..................... 136/203 |
| 4,500,742 | 2/1985 | Morimoto et al. ................... 136/206 |
| 4,871,263 | 10/1989 | Wilson ................................ 374/139 |

FOREIGN PATENT DOCUMENTS 56-152282 11/1981 Japan .

Primary Examiner—Peter A. Nelson
Assistant Examiner—C. D. Carroll
Attorney, Agent, or Firm—Frishauf, Holtz, Goodman & Woodward

[57] ABSTRACT

A thermoelectric element comprises a first layer of a p-type iron silicide, and a second layer of an n-type iron silicide. The first and second layers are joined together to form a pn junction therebetween. An insulating layer of an oxide is interposed between the first and second layers at portions thereof other than the pn junction. The oxide forming the insulating layer consists essentially of 38.0–50% by weight $SiO_2$, 0.1–10.0% by weight $B_2O_3$, and the balance of MgO and inevitable impurities. In manufacturing the thermoelectric element, one of a powder of the p-type iron silicide and a powder of the n-type iron silicide, a powder of the insulating layer-forming oxide, which may be in the form of a sheet, and the other of the powder of the p-type iron silicide and the powder of the n-type iron silicide are charged into a hot pressing mold in the mentioned order, whereby a laminated body is formed within the mold. The laminated body is hot pressed into a sintered body, which is then heated treated in the atmosphere.

7 Claims, 3 Drawing Sheets

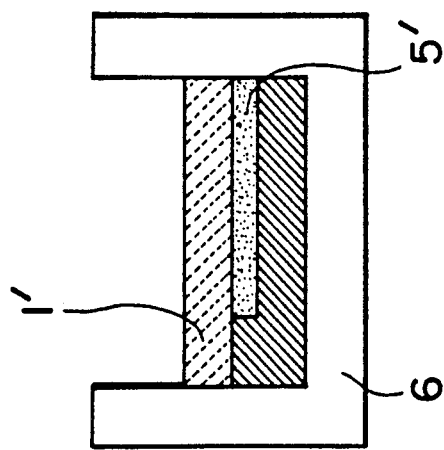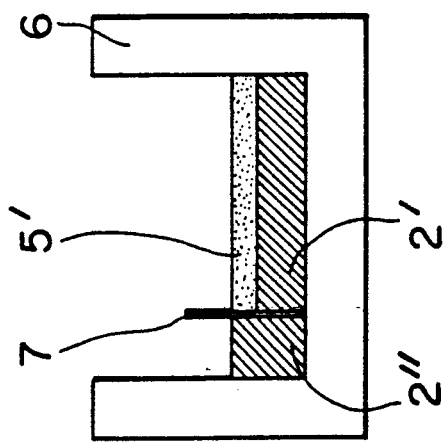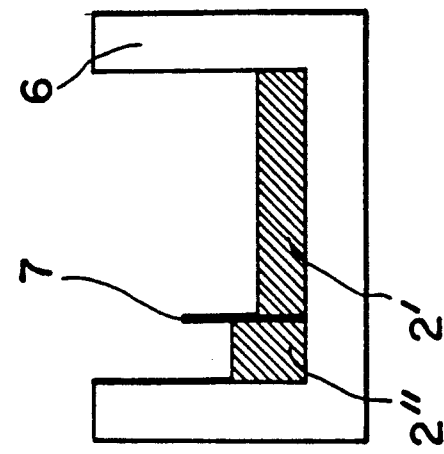

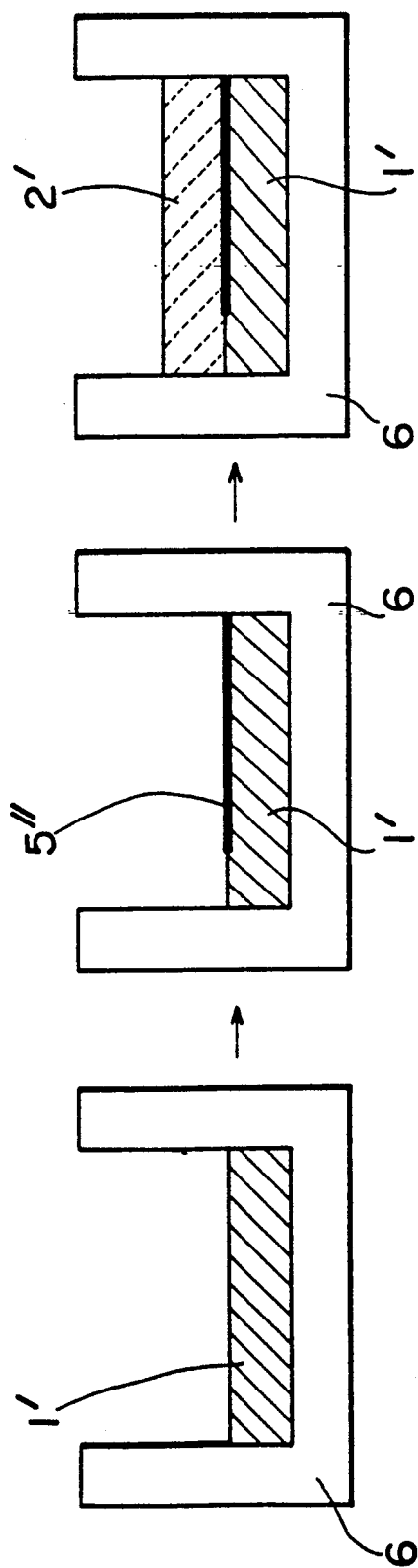

THERMOELECTRIC ELEMENT AND METHOD OF MANUFACTURING SAME

BACKGROUND OF THE INVENTION

This invention relates to a thermoelectric element which is mainly composed of an iron silicide and which can be used for power generation utilizing various kinds of heat sources, and a method of manufacturing same, and more particularly to a thermoelectric element and a method of manufacturing same, which can be used in a power source for holding open an electromagnetic valve for gas appliances such as a gas heater or the like.

In general, a thermoelectric element of this kind has a U-shaped structure as shown in FIG. 1, which comprises a pair of parts 1 and 2 formed, respectively, of a p-type iron silicide containing Mn, and an n-type iron silicide containing Co and joined together at ends thereof to form a pn junction 3 there, with a gap 4 defined between the parts 1, 2.

However, the thermoelectric element having such a U-shaped structure has insufficient mechanical strength at the pn junction 3 such that it can sometimes be broken even when a small external force is applied thereto, making it greatly inconvenient to handle the element in assembling and using same.

To eliminate such inconvenience, it has been proposed, e.g. by Japanese Provisional Patent Publication (Kokai) No. 56-152282 to interpose an insulating layer formed of an oxide such as forsterite ($2MgO.SiO_2$), aluminum oxide, magnesium oxide, and zirconium oxide between a layer of the p-type iron silicide and a layer of the n-type iron silicide along part of the entire length of the layers to form a laminated body with a pn junction at one end thereof, and sinter the laminated body into a thermoelectric element having a p-type iron silicide layer 1, an n-type iron silicide layer 2, and an intermediate insulating layer 5 as shown in FIG. 2. In the thermoelectric element thus obtained, the p-type iron silicide layer 1 and the n-type iron silicide layer 2 are joined together via the intermediate insulating layer 5, and therefore the pn junction 3 has considerably higher mechanical strength as compared with the thermoelectric element of the U-shaped structure shown in FIG. 1.

Among the above-mentioned insulating oxides which can be interposed between p-type and n-type iron silicide layers at portions thereof other than a pn junction-forming portion thereof, the forsterite ($2MgO.SiO_2$) has a coefficient of thermal expansion of $10-12 \times 10^{-6}/°C.$, which is close to that of $10 \times 10^{-6}$ of an iron silicide ($FeSi_2$), and is therefore suitable for use as the insulating layer of thermoelectric element. However, the forsterite ($2MgO.SiO_2$) cannot be sintered at a temperature not lower than 1300° C., whereas the melting point of the iron silicide ($FeSi_2$) is 1220° C. Consequently, if the laminated body formed of three layers of p-type iron silicide, n-type iron silicide, and forsterite is sintered at a temperature of 900°-1200° C. which is a suitable sintering temperature for the iron silicide ($FeSi_2$), the insulating layer formed of forsterite is not sintered to a sufficient degree, and hence the sintered insulating layer will have low density as well as insufficient strength. Consequently, the thermoelectric element having such an insulating layer of forsterite with low density has low thermal shock resistance. Further, the thermoelectric element has insufficient mechanical strength and can be broken during operation of installing a gas appliance, or oil can permeate the insulating layer during use of the gas appliance to degrade the degree of insulation.

SUMMARY OF THE INVENTION

It is the object of the invention to provide a thermoelectric element which is excellent in thermal shock resistance as well as in mechanical strength.

To attain the object, the present invention provides a thermoelectric element comprising a first layer of a p-type iron silicide, a second layer of an n-type iron silicide, the first and second layers being joined together to form a pn junction therebetween, and an insulating layer of an oxide interposed between the first and second layers at portions thereof other than the pn junction. The thermoelectric element is characterized by an improvement wherein the oxide forming the insulating layer consists essentially of:

$SiO_2$: 38.0-50 % by weight;
$B_2O_3$: 0.1-10.0 % by weight; and
the balance: MgO and inevitable impurities.

Further, the present invention provides a method of manufacturing a thermoelectric element, comprising the steps of:

charging into a hot pressing mold one of a powder of a p-type iron silicide and a powder of an n-type iron silicide;

charging into the hot pressing mold a powder of an insulating oxide, which may be in the form of a sheet, so as to lie over the one of the powder of the p-type iron silicide and the powder of the n-type iron silicide except at least part thereof, the insulating oxide consisting essentially of:

$SiO_2$: 38.0-50 % by weight;
$B_2O_3$: 0.1-10.0 % by weight; and
MgO and inevitable impurities: the balance;

charging into the hot pressing mold the other of the powder of the p-type iron silicide and the powder of the n-type iron silicide, so as to lie over the entire surface thereof, whereby a laminated body is formed within the hot pressing mold;

hot pressing the laminated body within the hot pressing mold into a sintered body; and subjecting the sintered body to heat treatment in the atmosphere.

The above and other objects, features, and advantages of the invention will become more apparent from the ensuing detailed description taken in conjunction with the accompanying drawings.

BRIEF DESCRIPTION OF THE DRAWINGS

FIGS. 3 (a)-(c) are views useful in explaining steps of charging powders for forming a thermoelectric element, into a hot pressing mold, according to the manufacturing method of the present invention; and FIGS. 4 (a)-(c) are views useful in explaining steps of charging powders and a sheet for forming a thermoelectric element, into a hot pressing mold, according to the manufacturing method of the present invention.

DETAILED DESCRIPTION

Figure 1:
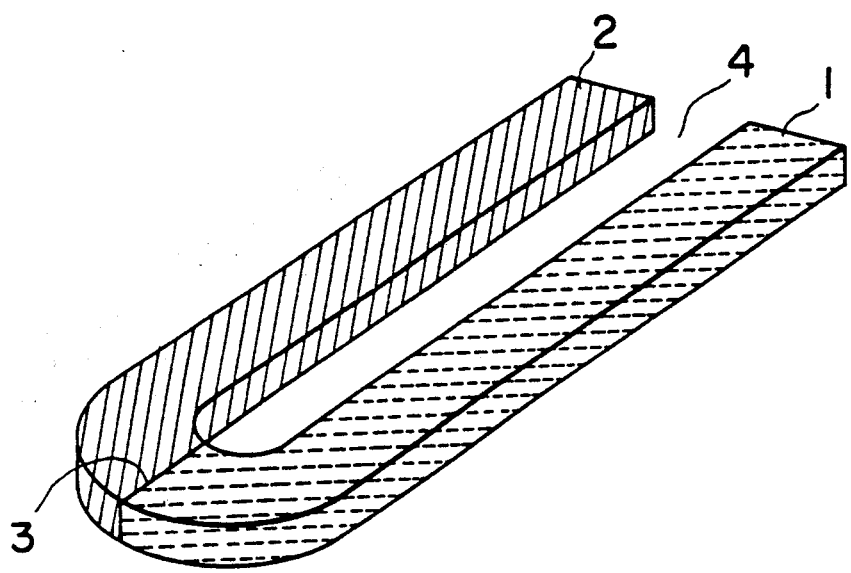
FIG. 1 is a perspective view of a conventional thermoelectric element.
Figure 2:
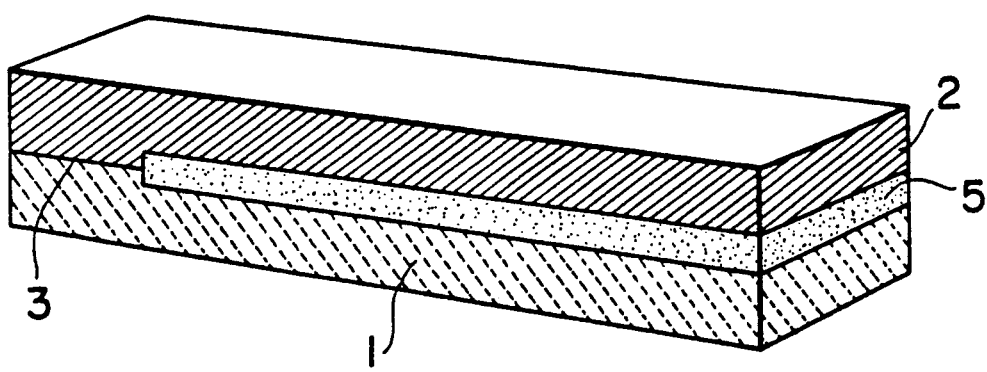
FIG. 2 is a perspective view of another conventional thermoelectric element.

Under the aforestated circumstances, the present inventors have made studies in order to develope an insulating oxide which can be sintered into a highly dense sintered body even at a low temperature falling within a range of 900°–1200° C., which is equal to the sintering temperature of an iron silicide (FeSi$_2$), and at the same time has substantially the same coefficient of thermal expansion with that of forsterite (2MgO.SiO$_2$), thereby being suitable for use as the insulating layer of a thermoelectric element, and have reached the following findings:

(1) If a small amount of B$_2$O$_3$ is added to forsterite (2MgO.SiO$_2$) and the forsterite with the additive is hot pressed at a temperature of 900°–1200° C., the resulting hot pressed body has high density enough to have a relative density of 95%. Further, a sintered body obtained from the hot pressed body has a coefficient of thermal expansion of 10–11×10$^{-6}$/° C., which is almost equal to the coefficient of thermal expansion of 10×10$^{-6}$/° C. of the iron silicide (FeSi$^2$);

(2) The amount of the additive B$_2$O$_3$ should be 10 % by weight or less, since if it is above 10 % by weight, it causes a decrease in the coefficient of thermal expansion of the insulating layer; and (3) Substantially the same results as above can be obtained even if the molar ratio between MgO and SiO$_2$ of the forsterite becomes deviated from 2 : 1 due to the addition of B$_2$O$_3$. To this end, the forsterite with the additive B$_2$O$_3$ should preferably have a chemical composition of SiO$_2$: 38–50 % by weight, B$_2$O$_3$: 0.1–10 % by weight, and the balance of MgO and inevitable impurities.

The present invention is based upon the above findings.

A thermoelectric element and a method of manufacturing same according to the invention have the aforesaid structure and steps, respectively.

The reason why the chemical composition of the insulating layer obtained by hot pressing a powder of the insulating oxide or a sheet containing same has been limited as stated above is as follows:

(a) SiO$_2$:

The SiO$_2$ is effective to reduce the sintering temperature. However, if its content is less than 38 % by weight, the sintering temperature cannot be reduced to a satisfactorily low level, whereas if it exceeds 50 % by weight, it causes an excessive decrease in the coefficient of thermal expansion of the insulating layer, i.e., to a far different value from that of FeSi$_2$ so that cracks can occur in the obtained product. Therefore, the SiO$_2$ content has been limited to a range of 38–50 % by weight, preferably 42–48 % by weight.

(b) B$_2$O$_3$:

The B$_2$O$_3$ acts to promote the action of SiO$_2$ of reducing the sintering temperature. However, if its content exceeds 10 % by weight, it causes an undesirable decrease in the coefficient of thermal expansion, whereas if it is below 0.1 % by weight, the action of SiO$_2$ cannot be promoted to a sufficient extent. This is why the B$_2$O$_3$ content has been limited to a range of 0.1–10 % by weight. A preferable range of the B$_2$O$_3$ content is 1–5 % by weight.

To obtain the powder of the insulating oxide, preferably a mixed powder having the above-mentioned composition is sintered at a high temperature so that a layer of forsterite is formed therein, and the sintered body is then crushed into the insulating oxide powder.

To manufacture a thermoelectric element according to the invention, first, a hot pressing mold 6 as shown in FIG. 3 (a) is prepared, and a partition plate 7 is placed upright into the mold 6. Then, an n-type iron silicide powder is charged into the mold 6 such that a relatively thinner n-type iron silicide powder layer 2' and a relatively thicker n-type iron silicide powder layer 2" are formed on opposite sides of the upright partition plate 7, as shown in FIG. 3 (a).

An insulating oxide powder is then charged into the mold 6 such that it is laid over the relatively thinner n-type iron silicide powder layer 2' alone to form an insulating oxide powder layer 5' thereon, as shown in FIG. 3 (b). Then, the partition plate 7 is removed from the mold 6a, and a p-type iron silicide powder is charged into the mold 6 in a manner being laid over the entire surface of the charged powders, as shown in FIG. 3 (c).

Thus, a powdery laminated body is formed within the mold 6 charged with the powders. The powdery laminated body is hot pressed into a hot pressed body, which in turn is heat treated in the atmosphere, to obtain a thermoelectric element.

On the other hand, to manufacture a thermoelectric element according to the invention by the use of a sheet containing the insulating oxide powder, first, a p-type iron silicide powder is charged into the hot pressing mold 6 to form a p-type iron silicide powder layer 1' therein, as shown in FIG. 4 (a). Then, a sheet 5" containing the insulating oxide powder is laid over the p-type iron silicide powder layer 1', with a pn junction-forming surface portion of the layer 1' left uncovered with the sheet, as shown in FIG. 4 (b). The sheet 5" containing the insulating oxide powder may be prepared by blending an organic binder into a powder of the insulating oxide, mixing the powder and binder together, and forming the mixture into a sheet by a doctor blade method. The thickness of the sheet 5" should preferably be 1 mm or less. If the thickness exceeds 1 mm, cracks can be formed in the hot pressed body.

Then, a powder of the n-type iron silicide is laid over the sheet 5" and the uncovered surface portion of the p-type iron silicide powder layer 1' to form an n-type iron silicide powder layer 2' thereon, as shown in FIG. 4 (c). In this way, a powdery laminated body is formed within the hot pressing mold 6. The powdery laminated body is then hot pressed into a hot pressed body, which in turn is heat treated in the atmosphere into a thermoelectric element.

The heat treatment is preferably carried out by holding the hot pressed body in the atmosphere at a temperature of 700°–800° C. for 100–200 hours.

Next, examples of the invention will be described below.

EXAMPLE 1

The following starting powders were prepared:

a powder of an n-type iron silicide having a chemical composition of Fe$_{1.94}$Co$_{0.06}$Si$_2$ and a mean particle size of 2.3 microns;

a powder of a p-type iron silicide having a chemical composition of Fe$_{1.90}$Mn$_{0.10}$Si$_2$ and a mean particle size of 3.2 microns; and powders of insulating oxides having respective chemical compositions shown in Table 1 and a mean particle size of 3.5 microns.

The above powders were charged into a hot pressing mold 6 in the manner shown in FIGS. 3 (a), (b), and (c), to obtain powdery laminated bodies. The powdery lamintaed bodies were hot pressed in vacuum under conditions shown in Table 1 into hot pressed bodies. The hot pressed bodies were heat treated under conditions shown in Table 1 into thermoelectric elements Nos. 1-13 according to the present on and comparative thermoelectric elements Nos. 1-4.

These obtained thermoelectric elements were measured in respect of bending strength when bent in the direction in which the layers are laminated, the results of which are shown in Table 1. Further, the thermoelectric elements were cut, and the structures of the insulating layers along the cut surfaces were examined with an optical metallurgical microscope to determine the presence of pores in the insulating layers, the results of which are shown in Table 1.

EXAMPLE 2

There were prepared powders of insulating oxides having respective chemical compositions shown in Table 2. A solution consisting essentially of the following ingredients, by % by weight, was added to the prepared insulating oxide powders:
acrylic resin: 10 %;
dioctyl phthalate: 1 %;
polyethylene glycol: 3 %;
toluene: 70 %; and
ethanol: the balance.

The insulating oxide powders with the additive solution were charged into a ball mill pot formed of polyethylene and mixed together with balls formed of $ZrO_2$ with a diameter of 10 mm, for 24 hours.

After the mixing, the $ZrO_2$ balls were removed from the mixed powders, followed by debubbling with an aspirator. The debubbled mixed powders were each formed into an insulating oxide powder-containing sheet having a thickness of 0.5 mm, by means of a doctor blade.

The thus obtained sheets were charged into a hot pressing mold 6 together with the same p-type iron silicide powder and n-type iron silicide powder that were prepared in Example 1, in the manner shown in FIGS. 4 (a)-(c). The charged sheet and the iron silicide powders were hot pressed under conditions shown in Table 2, followed by being subjected to a heat treatment, to obtain thermoelectric elements Nos. 14-26 according to the present invention and comparative thermoelectric elements Nos. 5-8.

TABLE 1

| TEST PIECES | CHEMICAL COMPOSITION OF INSULATING OXIDE POWDER IN SHEET | | | HOT PRESSING CONDITIONS | | | HEAT TREATING CONDITIONS | | BENDING STRENGTH (kg/mm$^2$) | PRESENCE OF PORES |
|---|---|---|---|---|---|---|---|---|---|---|
| | SiO$_2$ | B$_2$O$_3$ | MgO + INEVITABLE IMPURITIES | TEMPERATURE (°C.) | PRESSURE (kg/cm$^2$) | TIME (MINUTES) | TEMPERATURE (°C.) | TIME (HOUR) | | |
| THERMOELECTRIC ELEMENTS ACCORDING TO PRESENT INVENTION | | | | | | | | | | |
| 1 | 42.7 | 5.0 | Bal. | 1100 | 150 | 30 | 780 | 100 | 25 | Absent |
| 2 | 42.7 | 0.1 | " | 1150 | 150 | 30 | 780 | 100 | 30 | " |
| 3 | 42.7 | 10.0 | " | 1150 | 150 | 30 | 780 | 100 | 31 | " |
| 4 | 42.7 | 6.5 | " | 1180 | 100 | 30 | 780 | 100 | 27 | " |
| 5 | 42.7 | 8.0 | " | 1180 | 100 | 30 | 780 | 100 | 26 | " |
| 6 | 40.0 | 1.0 | " | 1180 | 100 | 30 | 780 | 100 | 26 | " |
| 7 | 40.0 | 3.0 | " | 1180 | 100 | 30 | 780 | 100 | 24 | " |
| 8 | 40.0 | 4.1 | " | 1150 | 150 | 30 | 780 | 100 | 27 | " |
| 9 | 47.0 | 0.5 | " | 1150 | 150 | 30 | 780 | 100 | 28 | " |
| 10 | 47.0 | 5.5 | " | 1180 | 150 | 30 | 780 | 100 | 25 | " |
| 11 | 38.0 | 8.0 | " | 1180 | 100 | 30 | 780 | 100 | 28 | " |
| 12 | 50.0 | 0.2 | " | 1180 | 100 | 30 | 780 | 100 | 30 | " |
| 13 | 45.0 | 1.0 | " | 1180 | 100 | 30 | 780 | 100 | 29 | " |
| COMPARATIVE THERMOELECTRIC ELEMENTS | | | | | | | | | | |
| 1 | 35* | 5.0 | " | 1180 | 150 | 30 | 780 | 100 | 18 | Present |
| 2 | 52* | 5.0 | " | 1180 | 150 | 30 | 780 | 100 | 15 | " |
| 3 | 42.7 | 12* | " | 1180 | 150 | 30 | 780 | 100 | 20 | " |
| 4 | 42.7 | —* | " | 1180 | 150 | 30 | 780 | 100 | 15 | " |

(*THE ASTERISKED VALUES FALL OUTSIDE THE RANGE OF THE PRESENT INVENTION)

TABLE 2

| TEST PIECES | CHEMICAL COMPOSITION OF INSULATING OXIDE POWDER | | | HOT PRESSING CONDITIONS | | | HEAT TREATING CONDITIONS | | BENDING STRENGTH (kg/mm$^2$) | PRESENCE OF PORES |
|---|---|---|---|---|---|---|---|---|---|---|
| | SiO$_2$ | B$_2$O$_3$ | MgO + INEVITABLE IMPURITIES | TEMPERATURE (°C.) | PRESSURE (kg/cm$^2$) | TIME (MINUTES) | TEMPERATURE (°C.) | TIME (HOUR) | | |
| THERMOELECTRIC ELEMENTS ACCORDING TO PRESENT INVENTION | | | | | | | | | | |
| 14 | 42.7 | 5.3 | Bal. | 1150 | 150 | 30 | 780 | 100 | 28 | Absent |
| 15 | 42.7 | 6.5 | " | 1150 | 150 | 30 | 780 | 100 | 28 | " |
| 16 | 42.7 | 8.1 | " | 1150 | 150 | 30 | 780 | 100 | 30 | " |
| 17 | 42.7 | 10.0 | " | 1150 | 150 | 30 | 780 | 100 | 31 | " |
| 18 | 42.7 | 0.1 | " | 1150 | 150 | 30 | 780 | 100 | 33 | " |
| 19 | 42.7 | 0.6 | " | 1180 | 100 | 30 | 780 | 100 | 29 | " |
| 20 | 40.0 | 1.0 | " | 1180 | 100 | 30 | 780 | 100 | 30 | " |
| 21 | 40.0 | 2.2 | " | 1180 | 100 | 30 | 780 | 100 | 30 | " |
| 22 | 38.0 | 3.4 | " | 1180 | 100 | 30 | 780 | 100 | 29 | " |
| 23 | 38.0 | 4.5 | " | 1180 | 100 | 30 | 780 | 100 | 28 | " |
| 24 | 45.0 | 7.0 | " | 1180 | 100 | 30 | 780 | 100 | 31 | " |
| 25 | 50.0 | 9.3 | " | 1180 | 100 | 30 | 780 | 100 | 31 | " |
| 26 | 50.0 | 0.3 | " | 1180 | 100 | 30 | 780 | 100 | 29 | " |
| COMPARATIVE THERMOELECTRIC ELEMENTS | | | | | | | | | | |

TABLE 2-continued

| TEST PIECES | CHEMICAL COMPOSITION OF INSULATING OXIDE POWDER | | | HOT PRESSING CONDITIONS | | | HEAT TREATING CONDITIONS | | BENDING STRENGTH (kg/mm$^2$) | PRESENCE OF PORES |
|---|---|---|---|---|---|---|---|---|---|---|
| | SiO$_2$ | B$_2$O$_3$ | MgO + INEVITABLE IMPURITIES | TEMPERATURE (°C.) | PRESSURE (kg/cm$^2$) | TIME (MINUTES) | TEMPERATURE (°C.) | TIME (HOUR) | | |
| 5 | 35* | 5.0 | " | 1180 | 150 | 30 | 780 | 100 | 18 | Present |
| 6 | 52* | 5.0 | " | 1180 | 150 | 30 | 780 | 100 | 18 | " |
| 7 | 42.7 | 13* | " | 1180 | 150 | 30 | 780 | 100 | 22 | " |
| 8 | 42.7 | —* | " | 1180 | 150 | 30 | 780 | 100 | 18 | " |

(*THE ASTERISKED VALUES FALL OUTSIDE THE RANGE OF THE PRESENT INVENTION)

These obtained thermoelectric elements were measured in respect of bending strength when bent in the direction in which the layers are laminated, under the same testing conditions as in Example 1, the results of which are shown in Table 2. Further, the thermoelectric elements were cut, and the structures of the insulating layers along the cut surfaces were examined with an optical metallurgical microscope to determine the presence of pores in the insulating layers, the results of which are shown in Table 2.

It will be noted from the results shown in Tables 1 and 2 that the thermoelectric elements No. 1-26 according to the present invention, which include insulating layers formed of insulating oxide powders satisfying the requirements o the present invention, are all free of pores and excellent in bending strength, the comparative thermoelectric elements Nos. 1-8, which include insulating layers, each having one of its components falling outside the content range of the present invention, as asterisked in Tables 1, 2, show the presence of pores therein and inferior bending strength.

Therefore, if the thermoelectric elements according to the present invention are used in a power source for holding open an electromagnetic valve for gas appliances, there is no possibility that oil, water, etc. permeate the insulating layers of the thermoelectric elements, and hence the thermoelectric elements will show for higher reliability than the conventional thermoelectric elements.

What is claimed is:

1. In a thermoelectric element comprising a first layer of a p-type iron silicide, a second layer of an n-type iron silicide, said first and second layers being joined together to form a pn junction therebetween, and an insulating layer of an oxide interposed between said first and second layers portions thereof other than said pn junction, the improvement wherein said oxide forming said insulating layer consists essentially of:
   SiO$_2$: 38.0–50 % by weight;
   B$_2$O$_3$: 0.1–10.0 % by weight; and
   MgO and inevitable impurities: the balance.

2. A thermoelectric element as claimed in claim 1, wherein SiO$_2$ is contained in said oxide forming said insulating layer in an amount of 42–48 % by weight.

3. A thermoelectric element as claimed in claim 1, wherein B$_2$O$_3$ is contained in said oxide forming said insulating layer in an amount of 1–5 % by weight.

4. A method of manufacturing a thermoelectric element comprising the steps of:
   charging into a hot pressing mold one of a powder of a p-type iron silicide and a powder of an n-type iron silicide;
   charging into said hot pressing mold a powder of an insulating oxide, so as to lie over said one of said powder of said p-type iron silicide and said powder of said n-type iron silicide except at least part thereof, said insulating oxide consisting essentially of:
   SiO$_2$: 38.0–50 % by weight;
   B$_2$O$_3$: 0.1–10.0 % by weight; and
   MgO and inevitable impurities: the balance;
   charging into said hot pressing mold the other of said powder of said p-type iron silicide and said powder of said n-type iron silicide, so as to lie over an entire surface thereof, whereby a laminated body is formed within said hot pressing mold; and
   hot pressing said laminated body within said hot pressing mold into a sintered body.

5. A method as claimed in claim 4, further including subjecting said sintered body to heat treatment in the atmosphere.

6. A method of manufacturing a thermoelectric element, comprising the steps of:
   charging into a hot pressing mold one of a powder of a p-type iron silicide and a powder of an n-type iron silicide;
   charging into said hot pressing mold a sheet containing a powder of an insulating oxide, so as to lie over said one of said powder of said p-type iron silicide and said powder of said n-type iron silicide except at least part thereof, said insulating oxide consisting essentially of:
   SiO$_2$: 38.0–50 % by weight;
   B$_2$O$_3$: 0.1–10.0 % by weight; and
   MgO and inevitable impurities: the balance;
   charging into said hot pressing mold the other of said powder of said p-type iron silicide and said powder of said n-type iron silicide, so as to lie over an entire surface thereof, whereby a laminated body is formed within said hot pressing mold; and
   hot pressing said laminated body within said hot pressing mold into a sintered body.

7. A method as claimed in claim 6, further including subjecting said sintered body to heat treatment in the atmosphere.

* * * * *